US012810768B2

(12) United States Patent
Yoon et al.

(10) Patent No.: US 12,810,768 B2
(45) Date of Patent: Nov. 24, 2026

(54) DISPLAY DEVICE AND METHOD OF DRIVING DISPLAY DEVICE

(71) Applicant: Samsung Display Co., LTD., Yongin-si (KR)

(72) Inventors: Seok Hoon Yoon, Yongin-si (KR); Jin Seuk Kim, Yongin-si (KR); Jong Heon Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 2 days.

(21) Appl. No.: 18/937,521

(22) Filed: Nov. 5, 2024

(65) Prior Publication Data

US 2025/0308432 A1 Oct. 2, 2025

(30) Foreign Application Priority Data

Mar. 28, 2024 (KR) ........................ 10-2024-0042323

(51) Int. Cl.

*G09G 3/3266* (2016.01)
*G09G 3/00* (2006.01)
*G09G 3/20* (2006.01)
*H10K 59/131* (2023.01)

(52) U.S. Cl.

CPC ........... *G09G 3/2096* (2013.01); *G09G 3/006* (2013.01); *G09G 3/3266* (2013.01); *G09G 2310/06* (2013.01); *G09G 2320/043* (2013.01); *H10K 59/131* (2023.02)

(58) Field of Classification Search

CPC .. G09G 3/00; G09G 3/10; G09G 3/20; G09G 3/30; G09G 3/32; G09G 3/34; G09G 3/36; G09G 3/006; G09G 3/2096; G09G 3/3266; G09G 3/3275; G09G 3/3233; G09G 3/3225; G09G 3/3258; G09G 2310/06; G09G 2320/043; G09G 5/00; G09G 5/10; G09G 5/18; H10K 59/131; G02F 1/1345; G02F 1/1333; G02F 1/1362; H01L 21/66; H01L 23/00; H01L 23/49; H01L 23/58; H01L 23/498; H01L 25/07; H01L 27/12; H01L 27/32; H01L 51/00; H01L 51/52;

(Continued)

(56) References Cited

U.S. PATENT DOCUMENTS 10,403,689 B2 9/2019 Park et al.
2007/0167036 A1 * 7/2007 Kim ........................ H05K 1/189 439/66

(Continued)

FOREIGN PATENT DOCUMENTS

KR 102423681 B1 7/2022

*Primary Examiner* — Chanh D Nguyen
*Assistant Examiner* — Nguyen H Truong
(74) *Attorney, Agent, or Firm* — CANTOR COLBURN LLP

(57) ABSTRACT

A display device includes a display panel including a plurality of pixels, a driving integrated circuit for generating and outputting a first gate driver control signal to be supplied to the display panel and feeding back, as a first feedback signal, the first gate driver control signal provided to the display panel, and a first conductive ball electrically connecting the driving integrated circuit and the display panel to each other. The driving integrated circuit compares a waveform of the first gate driver control signal with a waveform of the first feedback signal.

17 Claims, 12 Drawing Sheets

(58) Field of Classification Search
CPC .......... H01L 9/02; H01L 9/20; H04N 13/344; G06F 3/038; H05K 1/09
See application file for complete search history.

(56) References Cited

U.S. PATENT DOCUMENTS

| | | | | |
|---|---|---|---|---|
| 2008/0007505 | A1* | 1/2008 | Kim | G09G 3/3648 345/87 |
| 2016/0163279 | A1* | 6/2016 | Hong | G09G 3/20 345/212 |
| 2016/0365051 | A1* | 12/2016 | Jung | G09G 3/3677 |
| 2017/0309646 | A1* | 10/2017 | Son | G06F 1/1637 |
| 2020/0394968 | A1* | 12/2020 | Kwon | G09G 3/3291 |
| 2020/0402433 | A1* | 12/2020 | Kim | G09G 3/006 |
| 2025/0273103 | A1* | 8/2025 | Woo | G09G 3/3275 |
| 2025/0386627 | A1* | 12/2025 | Paek | H10H 20/857 |

* cited by examiner

DISPLAY DEVICE AND METHOD OF DRIVING DISPLAY DEVICE

The application claims priority to Korean patent application No. 10-2024-0042323, filed on Mar. 28, 2024, and all the benefits accruing therefrom under 35 U.S.C. § 119, the content of which in its entirety is herein incorporated by reference.

BACKGROUND

1. Field

The disclosure generally relates to a display device and a method of driving a display device.

2. Related Art

A driving integrated circuit for driving a display panel may be electrically coupled to the display panel through conductive balls. Control signals output from the driving integrated circuit may be transferred to the display panel via the conductive balls.

SUMMARY

Oxidation occurring in the conductive balls due to driving for a substantially long time may cause an increase in resistance, a disconnection, a short circuit, a bonding failure, and the like, and unintentionally change waveforms of the control signals supplied to the display panel. In addition, this may result in deterioration of the reliability of a display device.

Embodiments provide a display device and a method of driving a display device, in which control signals supplied to a display panel are adjusted, thereby reducing a corrosion rate of conductive balls.

In an embodiment of the disclosure, there is provided a display device including: a display panel including a plurality of pixels; a driving integrated circuit which generates and outputs a first gate driver control signal to be supplied to the display panel, and feed back, as a first feedback signal, the first gate driver control signal provided to the display panel; and a first conductive ball electrically connecting the driving integrated circuit and the display panel to each other, where the driving integrated circuit compares a waveform of the first gate driver control signal with a waveform of the first feedback signal.

In an embodiment, the display panel may include: a first gate driver which supplies gate signals to the plurality of pixels; a first pad receiving the first gate driver control signal from the driving integrated circuit through the first conductive ball; and a first test pad which detects the first gate driver control signal passing through the first pad, and transfers the first gate driver control signal as the first feedback signal to the driving integrated circuit.

In an embodiment, the display device may further include a second conductive ball electrically connecting the driving integrated circuit and the display panel to each other. The driving integrated circuit may generate and output a second gate driver control signal, and feed back, as a second feedback signal, the second gate driver control signal provided to the display panel. The driving integrated circuit may compare a waveform of the second gate driver control signal with a waveform of the second feedback signal.

In an embodiment, the display panel may further include: a second gate driver which is spaced apart from the first gate driver in a first direction, and supplies the gate signals to the plurality of pixels; a fourth pad receiving the second gate driver control signal from the driving integrated circuit through the second conductive ball; and a second test pad which detects the second gate driver control signal passing through the fourth pad, and transfers the second gate driver control signal as the second feedback signal to the driving integrated circuit.

In an embodiment, the first gate driver control signal and the second gate driver control signal may be substantially identical to each other.

In an embodiment, the driving integrated circuit may include: a timing controller which generates the first gate driver control signal; input pads including a 1bth input pad receiving the first feedback signal transferred from the first test pad; and a waveform comparator which compares the waveform of the first gate driver control signal with the waveform of the first feedback signal, and compares the waveform of the second gate driver control signal with the waveform of the second feedback signal.

In an embodiment, the driving integrated circuit may further include a control signal generator which receives a waveform comparison result transferred from the waveform comparator. The control signal generator may modify the first gate driver control signal, based on the waveform comparison result.

In an embodiment, the driving integrated circuit may further include an output pad unit which connects the control signal generator to the first conductive ball. The output pad unit may apply a modified first gate driver control signal output from the control signal generator to the first conductive ball.

In an embodiment, a magnitude of an amplitude of a modified first gate driver control signal may be smaller than a magnitude of an amplitude of the first gate driver control signal.

In an embodiment, the control signal generator may modify the first gate driver control signal when the waveform of the first gate driver control signal and the waveform the first feedback signal are different from each other in at least a partial period.

In an embodiment of the disclosure, there is provided a method of driving a display device including a display panel and a first conductive ball electrically connected to the display panel, the method including: generating and outputting a first gate driver control signal to be supplied to the display panel; feeding back the first gate driver control signal as a first feedback signal from the display panel; and comparing a waveform of the first gate driver control signal with a waveform of the first feedback signal.

In an embodiment, the display panel may further include a first pad and a first test pad. The first gate driver control signal passing through the first pad may be fed back as the first feedback signal by the first test pad.

In an embodiment, the display device may further include a second conductive ball electrically connected to the display panel. The method may further include: generating and outputting a second gate driver control signal to be supplied to the display panel; feeding back the second gate driver control signal as a second feedback signal from the display panel; and comparing a waveform of the second gate driver control signal with a waveform of the second feedback signal.

In an embodiment, the display panel may further include a fourth pad and a second test pad. The second gate driver control signal passing through the fourth pad may be fed back as the second feedback signal by the second test pad.

In an embodiment, the first gate driver control signal and the second gate driver control signal may be substantially identical to each other.

In an embodiment, the first gate driver control signal may be modified based on a result obtained by comparing the waveform of the first gate driver control signal with the waveform of the first feedback signal.

In an embodiment, the modified first gate driver control signal may be applied to the first conductive ball.

In an embodiment, a magnitude of an amplitude of the modified first gate driver control signal may be smaller than a magnitude of an amplitude of the first gate driver control signal.

In an embodiment, the first gate driver control signal may be modified when the waveform of the first gate driver control signal and the waveform of the first feedback signal are different from each other in at least a partial period.

BRIEF DESCRIPTION OF THE DRAWINGS

Embodiments will now be described more fully hereinafter with reference to the accompanying drawings.

DETAILED DESCRIPTION

Figure 1:
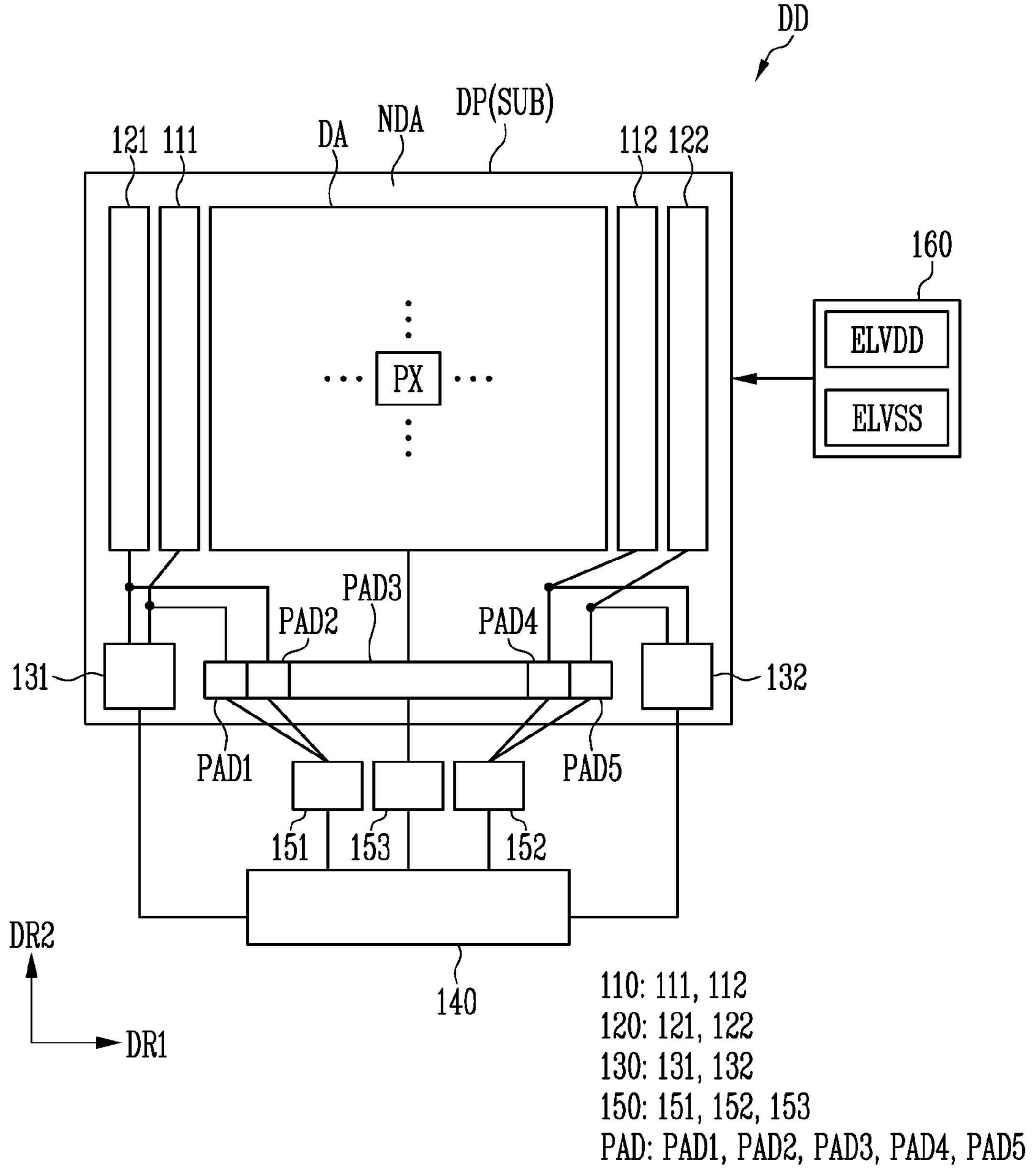
FIG. 1 is a schematic block diagram illustrating an embodiment of a display device in accordance with the disclosure.

Hereinafter, embodiments of the disclosure will be described in more detail with reference to the accompanying drawings. In the description below, only a desired part to understand an operation according to the disclosure is described and the descriptions of other parts are omitted in order not to unnecessarily obscure subject matters of the disclosure. In addition, the disclosure is not limited to embodiments described herein, but may be embodied in various different forms. Rather, embodiments described herein are provided to thoroughly and completely describe the disclosed contents and to sufficiently transfer the ideas of the disclosure to a person of ordinary skill in the art.

In the entire specification, when an element is referred to as being "connected" or "coupled" to another element, it may be directly connected or coupled to the another element or be indirectly connected or coupled to the another element with one or more intervening elements interposed therebetween. The technical terms used herein are used only for the purpose of illustrating an illustrative embodiment and not intended to limit the embodiment. It will be understood that when a component "includes" an element, unless there is another opposite description thereto, it should be understood that the component does not exclude another element but may further include another element. It will be understood that for the purposes of this disclosure, "at least one of X, Y, and Z" may be construed as X only, Y only, Z only, or any combination of two or more items X, Y, and Z (e.g., XYZ, XYY, YZ, ZZ). Similarly, for the purposes of this disclosure, "at least one selected from the group consisting of X, Y, and Z" may be construed as X only, Y only, Z only, or any combination of two or more items X, Y, and Z (e.g., XYZ, XYY, YZ, ZZ).

It will be understood that, although the terms "first", "second," etc. may be used herein to describe various elements, these elements should not be limited by these terms. These terms are only used to distinguish one element from another element. Thus, a "first" element discussed below could also be termed a "second" element without departing from the teachings of the disclosure.

Spatially relative terms, such as "below," "above," and the like, may be used herein for ease of description to describe the relationship of one element to another element, as illustrated in the drawing figures. In the drawing figures, dimensions may be exaggerated for clarity of illustration, for example. It will be understood that when an element is referred to as being "between" two elements, it may be the only element between the two elements, or one or more intervening elements may also be present. Like reference numerals refer to like elements throughout.

It will be understood that the spatially relative terms, as well as the illustrated configurations, are intended to encompass different orientations of the apparatus in use or operation in addition to the orientations described herein and depicted in the drawing figures. For example, if the apparatus in the drawing figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

In addition, the embodiments of the disclosure are described here with reference to schematic diagrams of ideal embodiments (and an intermediate structure) of the disclosure, so that changes in a shape as shown due to, for example, manufacturing technology and/or a tolerance may be expected. Therefore, the embodiments of the disclosure shall not be limited to the predetermined shapes of a region shown here, but include shape deviations caused by, for example, the manufacturing technology. The regions shown in the drawings are schematic in nature, and the shapes thereof do not represent the actual shapes of the regions of the device, and do not limit the scope of the disclosure.

The terms such as "comparator," "generator" or "unit" as used herein is intended to mean a hardware component that performs a predetermined function. The hardware component may include a circuitry such as a field-programmable gate array ("FPGA") or an application-specific integrated circuit ("ASIC"), for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a schematic block diagram illustrating an embodiment of a display device in embodiments of the disclosure.

Referring to FIG. 1, the display device DD may include a display panel DP, a driving integrated circuit 140, conductive balls 150, and a power supply 160. The display panel DP may include a substrate SUB, gate drivers 110, emission drivers 120, test pads 130, and pads PAD.

The substrate SUB (or the display panel DP) may include a display area DA in which an image is displayed and a non-display area NDA at the periphery of the display area DA (e.g., an edge area of the display area DA). A plurality of pixels PX may be disposed in the display area DA of the display panel DP. The gate drivers 110, the emission drivers 120, test pads 130, the pads PAD, and signal lines (e.g., gate lines (not shown), data lines (not shown), and emission control lines (not shown)) may be disposed in the non-display area NDA of the display panel DP.

The gate drivers 110 may supply gate signals to the plurality of pixels PX through the gate lines. More specifically, the gate drivers 110 may generate gate signals, based on first and second gate driver control signals SCS1 and SCS2 (refer to FIG. 3), and provide the gate signals to the gate lines. The first and second gate driver control signals SCS1 and SCS2 may be supplied from the driving integrated circuit 140. In an embodiment, each of the first and second gate driver control signals SCS1 and SCS2 may be provided in a pulse form alternately having a first gate power voltage VGH (e.g., a voltage having a level of a positive value) (refer to FIG. 3) and a second gate power voltage VGL (e.g., a voltage having a level of a negative value) (refer to FIG. 3). In another embodiment, each of the first and second gate driver control signals SCS1 and SCS2 may be provided in a linear form having the first gate power voltage VGH. The first gate driver control signal SCS1 and the second gate driver control signal SCS2 may be substantially the same signal.

The gate drivers 110 may include a first gate driver 111 and a second gate driver 112. The first gate driver 111 and the second gate driver 112 may be spaced apart from each other in a first direction DR1.

The emission drivers 210 may supply emission control signals to the plurality of pixels PX through the emission control lines. More specifically, the emission drivers 120 may generate emission control signals, based on first and second emission driver control signals ECS1 and ECS2 (refer to FIG. 3), and provide the emission control signals to the emission control lines. The first and second emission driver control signals ECS1 and ECS2 may be supplied from the driving integrated circuit 140. In an embodiment, each of the first and second emission driver control signals ECS1 and ECS2 may be provided in a pulse form having alternately having a first gate power voltage VGH (e.g., a voltage having a level of a positive value) and a second gate power voltage VGL (e.g., a voltage having a level of a negative value). In another embodiment, each of the first and second emission driver control signals ECS1 and ECS2 may be provided in a linear form having the first gate power voltage VGH. The first emission driver control signal ECS1 and the second emission driver control signal ECS2 may be substantially the same signal.

The emission drivers 120 may include a first emission driver 121 and a second emission driver 122. The first emission driver 121 and the second emission driver 122 may be spaced apart from each other in the first direction DR1.

In some embodiments, the gate drivers 110 and the emission drivers 120 may be integrated with the pixels PX to be formed in the display panel DP. However, the disclosure is not limited thereto. In an embodiment, the gate drivers 110 may be implemented as a separate integrated circuit distinguished from the display panel DP, and be disposed (e.g., mounted) in the driving integrated circuit 140, for example. In FIG. 1, it is illustrated that the gate drivers 110 are disposed in the non-display area NDA. However, the disclosure is not limited thereto. In an embodiment, the gate drivers 110 may be distributedly disposed in the display area DA (e.g., between pixels PX), for example.

A data driver 143 (refer to FIG. 2) may be disposed (e.g., mounted) in the driving integrated circuit 140, and be connected to the data lines through a third pad (e.g., third data pad) PAD3. The data driver 143 may supply data signals to the plurality of pixels PX through the data lines.

The test pads 130 may include a first test pad 131 and a second test pad 132. The first test pad 131 and the second test pad 132 may be spaced apart from each other in the first direction DR1.

As shown in FIG. 1, each of the first gate driver 111 and the first emission driver 121 may be connected to the driving integrated circuit 140 through the first test pad 131. The first test pad 131 may detect the first gate driver control signal SCS1 passing through a first pad (e.g., first data pad) PAD1, and transfer the first gate driver control signal SCS1 in the form of an eleventh feedback signal (also referred to a first feedback signal) FDS11 (refer to FIG. 3) to the driving integrated circuit 140. Also, the first test pad 131 may detect the first emission driver control signal ECS1 passing through a second pad (e.g., second data pad) PAD2, and transfer the first emission driver control signal ECS1 in the form of a twenty-first feedback signal FDS21 (refer to FIG. 3) to the driving integrated circuit 140.

As shown in FIG. 1, each of the second gate driver 112 and the second emission driver 122 may be connected to the driving integrated circuit 140 through the second test pad 132. The second test pad 132 may detect the second gate driver control signal SCS2 passing through a fourth pad (e.g., fourth data pad) PAD4, and transfer the second gate driver control signal SCS2 in the form of a twelfth feedback signal (also referred to a second feedback signal) FDS12 (refer to FIG. 3) to the driving integrated circuit 140. Also, the second test pad 132 may detect the second emission driver control signal ECS2 passing through a fifth pad (e.g., fifth data pad) PAD5, and transfer the second emission driver control signal ECS2 in the form of a twenty-second feedback signal FDS22 (refer to FIG. 3) to the driving integrated circuit 140.

The driving integrated circuit 140 may be electrically connected to the display panel DP through the conductive balls 150. The driving integrated circuit 140 may generate and output signals (e.g., the first gate driver control signal SCS1, the second gate driver control signal SCS2, the first emission driver control signal ECS1, the second emission driver control signal ECS2, or the like).

The driving integrated circuit 140 may compare a waveform of a signal output from the driving integrated circuit 140 with a waveform of a signal fed back and transferred to the driving integrated circuit 140. In an embodiment, the driving integrated circuit 140 may compare a waveform of the first gate driver control signal SCS1 with a waveform of the eleventh feedback signal FDS11 fed back and transferred through the first test pad 131, for example.

When the display device DD is in a normal state, the waveform of the signal output from the driving integrated circuit 140 and the waveform of the signal fed back and transferred to the driving integrated circuit 140 may be substantially the same as each other.

When the display device DD is in an abnormal state (e.g., a state in which at least some of the conductive balls 150 are oxidized (or corroded)), the waveform of the signal output from the driving integrated circuit 140 and the waveform of the signal fed back and transferred to the driving integrated circuit 140 may be different from each other in at least a partial period.

When the display device DD is in an abnormal state, the driving integrated circuit 140 may modify waveforms of signals output from the driving integrated circuit 140 so as to reduce an oxidation (or corrosion) rate of the conductive balls 150. This will be described in detail later with reference to FIGS. 6 and 8.

The conductive balls 150 may include the first conductive ball 151, a second conductive ball 152, and a third conductive ball 153. The conductive balls 150 may electrically connect the display panel DP and the driving integrated circuit 140 to each other. In an embodiment, the first conductive ball 151 may electrically connect each of the first and second pads PAD1 and PAD2 of the display panel DP to the driving integrated circuit 140, for example. In an embodiment, the third conductive ball 153 may electrically connect the third pad PAD3 of the display panel DP to the driving integrated circuit 140, for example. The second conductive ball 152 may electrically connect each of the fourth and fifth pads PAD4 and PAD5 of the display panel DP to the driving integrated circuit 140.

Signals (e.g., the first gate driver control signal SCS1, the second gate driver control signal SCS2, or the like) output from the driving integrated circuit 140 may be supplied to the display panel DP via the conductive balls 150. When a voltage difference between the driving integrated circuit 140 and the conductive balls 150 is larger, a stronger electric field may be generated between the driving integrated circuit 140 and the conductive balls 150, so that electrons move. When such a state is continued for a relatively long time, the conductive balls 150 may be gradually oxidized (or corroded).

As the amplitudes of the signals output from the driving integrated circuit 140 become larger, the intensity of the electric field generated by the voltage difference between the driving integrated circuit 140 and the conductive balls 150 may become stronger. Accordingly, electrons of the conductive balls 150 may easily move to the driving integrated circuit 140, and the oxidation (or corrosion) rate of the conductive balls 150 may become faster.

When the conductive balls 150 are oxidized (or corroded), the waveforms of the signals may be modified while passing through the conductive balls 150. The signals of which the waveforms are modified may be supplied to the display panel DP. In addition, as signals of which waveforms are unintentionally modified are supplied to the display panel DP, the reliability of the display device may be deteriorated. As the oxidation (or corrosion) of the conductive balls 150 is accelerated, the modification degree of the signals supplied to the display panel DP may become larger, and the deterioration of the reliability of the display device may become severer.

The driving integrated circuit 140 in the embodiments of the disclosure adjusts a waveform of a signal output from the driving integrated circuit 140, thereby reducing a rate at which the conductive balls 150 are oxidized (or corroded).

The pads PAD may include the first pad PAD1, the second pad PAD2, the third pad PAD3, the fourth pad PAD4, and the fifth pad PAD5. The first pad PAD1 may electrically connect between the first emission driver 121 and the first conductive ball 151. The second pad PAD2 may electrically connect between the first gate driver 111 and the first conductive ball 151. The third pad PAD3 may electrically connect between the third conductive ball 153 and the pixels PX. The fourth pad PAD4 may electrically connect between the second gate driver 112 and the second conductive ball 152. The fifth pad PAD5 may electrically connect between the second emission driver 122 and the second conductive ball 152. The pads PAD may be components for inputting, to the inside of the display panel DP, signals (e.g., the first gate driver control signal SCS1, the second gate driver control signal SCS2, the first emission driver control signal ECS1, the second emission driver control signal ECS2, or the like) passing through the conductive balls 150.

The power supply 160 may transfer a first power voltage ELVDD and a second power voltage ELVSS to the pixels PX. The first power voltage ELVDD and the second power voltage ELVSS may be power voltages desired for operations of the pixels PX. In an embodiment, the first power voltage ELVDD may have a voltage level higher than a voltage level of the second power voltage ELVSS.

Figure 2:
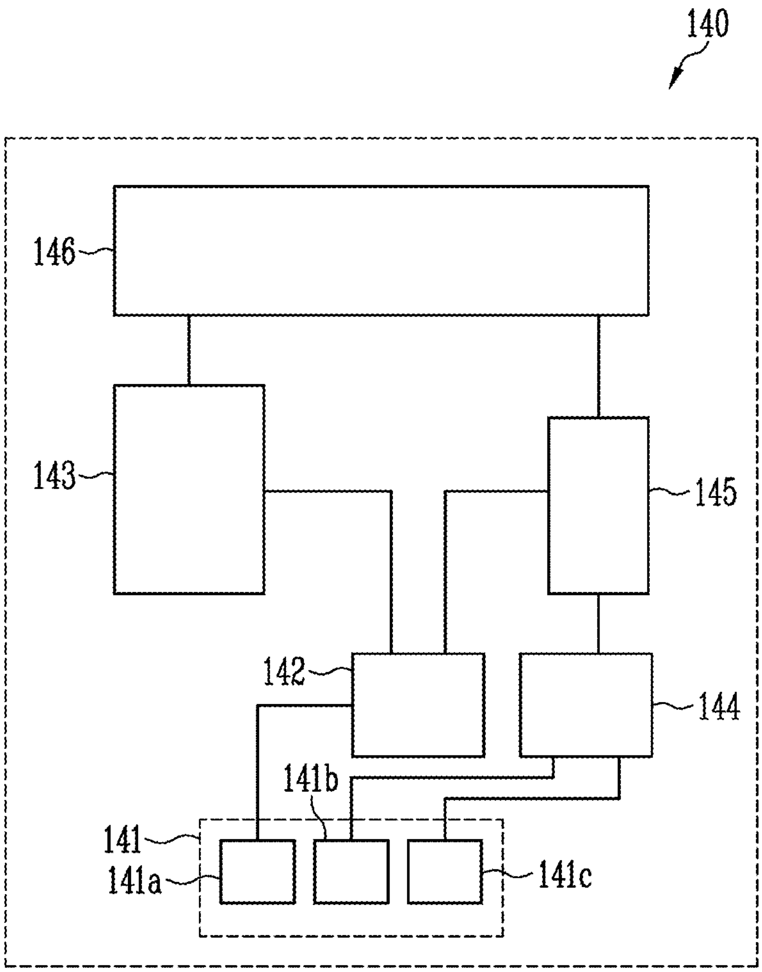
FIG. 2 is a schematic block diagram illustrating a driving integrated circuit shown in FIG. 1.
Figure 3:
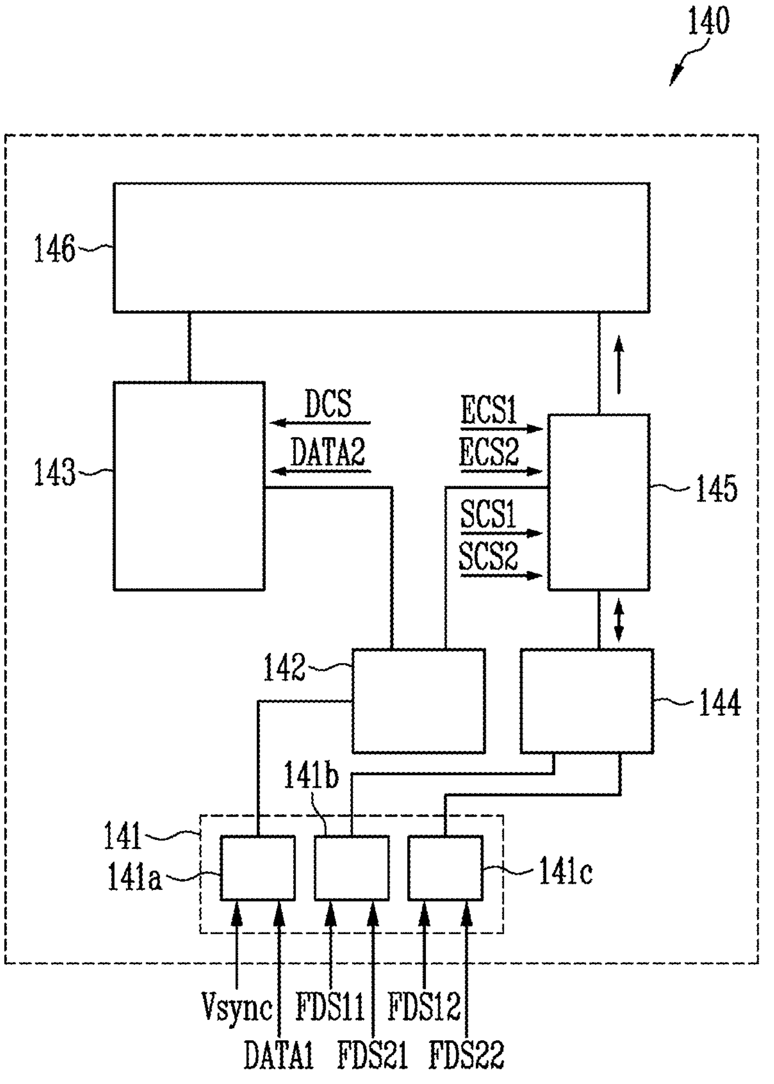
FIG. 3 is a diagram illustrating an embodiment of the driving integrated circuit shown in FIG. 2.

FIG. 2 is a schematic block diagram illustrating the driving integrated circuit shown in FIG. 1. FIG. 3 is a diagram illustrating an embodiment of the driving integrated circuit shown in FIG. 2.

Referring to FIGS. 1 to 3, the driving integrated circuit 140 may include input pads 141, a timing controller 142, a data driver 143, a waveform comparator 144, a control signal generator 145, an output pad unit 146, or the like.

The input pads 141 may include a plurality of input pads (e.g., a 1ath input pad 141*a*, a 1bth input pad 141*b*, a 1cth input pad 141*c*, or the like).

The 1ath input pad 141*a* may receive input image data DATA1 and a control signal from an external device (e.g., a graphic processor, a set top box, or the like). The control signal may include a vertical synchronization signal Vsync, a horizontal synchronization signal, a data enable signal, a reference clock signal, or the like. The 1ath input pad 141*a* may be electrically connected to the timing controller 142. The 1ath input pad 141*a* may transfer the received input image data DATA1 and the received control signal to the timing controller 142.

The 1bth input pad 141*b* may receive an eleventh feedback signal FDS11 and a twenty-first feedback signal FDS21 from the first test pad 131. The 1bth input pad 141*b* may be electrically connected to the waveform comparator 144. The 1bth input pad 141*b* may transfer the received eleventh feedback signal FDS11 and the received twenty-first signal FDS21 to the waveform comparator 144.

The 1cth input pad 141*c* may receive a twelfth feedback signal FDS12 and a twenty-second feedback signal FDS22 from the second test pad 132. The 1cth input pad 141*c* may be electrically connected to the waveform comparator 144. The 1cth input pad 141*c* may transfer the received twelfth feedback signal FDS12 and the received twenty-second feedback signal FDS22 to the waveform comparator 144.

The timing controller 142 may be electrically connected to the 1ath input pad 141*a*, to receive the input image data DATA1 and the control signal, which are transferred from the 1ath input pad 141*a*. The timing controller 142 may generate a first gate driver control signal SCS1, a second gate driver control signal SCS2, a first emission driver control signal ECS1, and a second emission driver control signal ECS2, based on the control signal. The timing controller 142 may generate a data driver control signal DCS, based on the control signal. The timing controller 142 may generate image data DATA2 by converting the input image data DATA1. In an embodiment, the timing controller 142 may convert the input image data DATA1 into the image data DATA2 having a format corresponding to a pixel arrangement in the display panel DP, for example.

The first gate driver control signal SCS1, the second gate driver control signal SCS2, the first emission driver control signal ECS1, and the second emission driver control signal ECS2 may include a start signal (or start pulse), clock signals, or the like.

The timing controller 142 may be electrically connected to the data driver 143. The timing controller 142 may transfer the data driver control signal DCS and the image data DATA2 to the data driver 143. The timing controller 142 may be electrically connected to the control signal generator 145. The timing controller 142 may transfer the first gate driver control signal SCS1, the second gate driver control signal SCS2, the first emission driver control signal ECS1, and the second emission driver control signal ECS2 to the control signal generator 145.

The data driver 143 may receive the data driver control signal DCS and the image data DATA2 from the timing controller 142, and generate data signals (or data voltages) corresponding to the image data DATA2. The data driver 143 may provide the generated data signals to the display panel DP through the output pad unit 146. In an embodiment, the data driver 143 may generate data signals corresponding to grayscale values in the image data, and supply the data signal to the data lines in units of pixel rows, for example.

The data driver 143 may be disposed (e.g., mounted) in the driving integrated circuit 140, be connected to the timing controller 142, and be connected to the data lines through the output pad unit 146, the third conductive ball 153, and the third pad PAD3.

In FIG. 2, it is illustrated that the timing controller 142 and the data driver 143 are implemented as separate integrated circuits in the driving integrated circuit 140. However, the disclosure is not limited thereto. In an embodiment, the timing controller 142 and the data driver 143 may be implemented into one integrated circuit, for example.

The waveform comparator 144 may be electrically connected to the 1bth pad 141*b* and the 1cth pad 141*c*. The waveform comparator 144 may receive the eleventh feedback signal FDS11 and the twenty-first feedback signal FDS21, which are transferred from the 1bth pad 141*b*. The waveform comparator 144 may receive the twelfth feedback signal FDS12 and the twenty-second feedback signal FDS22, which are transferred from the 1cth pad 141*c*.

The waveform comparator 144 may be electrically connected to the control signal generator 145. The waveform comparator 144 may receive the first gate driver control signal SCS1, the second gate driver control signal SCS2, the first emission driver control signal ECS1, and the second emission driver control signal ECS2, which are transferred from the control signal generator 145.

The waveform comparator 144 may perform an operation of comparing, with each other, the signals transferred from the 1bth input pad 141*b*, the 1cth input pad 141*c*, and the control signal generator 145. In an embodiment, the waveform comparator 144 may compare a waveform of the first gate driver control signal SCS1 with a waveform of the eleventh feedback signal FDS11, for example. In an embodiment, the waveform comparator 144 may compare a waveform of the first emission driver control signal ECS1 with a waveform of the twenty-first feedback signal FDS21, for example. In an embodiment, the waveform comparator 144 may compare a waveform of the second gate driver control signal SCS2 with a waveform of the twelfth feedback signal FDS12, for example. In an embodiment, the waveform comparator 144 may compare a waveform of the second emission driver control signal ECS2 with a waveform of the twenty-second feedback signal FDS22, for example. Also, the waveform comparator 144 may transfer, to the control signal generator 145, a waveform comparison result obtained by comparing the waveforms of the signals.

The control signal generator 145 may be electrically connected to the waveform comparator 144, to receive the waveform comparison result transferred from the waveform comparator 144.

When the display device DD is in an abnormal state (e.g., a state in which the first conductive ball 151 is oxidized (or corroded)), a difference may occur between the waveform of the first gate driver control signal SCS1 and the waveform of the eleventh feedback signal FDS11. Similarly, a difference may occur between the waveform of the first emission driver control signal ECS1 and the waveform of the twenty-first feedback signal FDS21. The control signal generator 145 may determine whether the display device DD is in a normal state or in an abnormal state through a waveform comparison result of the first gate driver control signal SCS1 and the eleventh feedback signal FDS11 or a waveform comparison result of the first emission driver control signal ECS1 and the twenty-first feedback signal FDS21.

When the display device DD is in an abnormal state (e.g., a state in which the second conductive ball 152 is oxidized (or corroded)), a difference may occur between the waveform of the second gate driver control signal SCS2 and the waveform of the twelfth feedback signal FDS12. Similarly, a difference may occur between the waveform of the second emission driver control signal ECS2 and the waveform of the twenty-second feedback signal FDS22. The control signal generator 145 may determine whether the display device DD is in a normal state or in an abnormal state through a waveform comparison result of the second gate driver control signal SCS2 and the twelfth feedback signal FDS12 or a waveform comparison result of the second emission driver control signal ECS2 and the twenty-second feedback signal FDS22. According to whether the display device DD is in a normal state or in an abnormal state, an operation of the control signal generator 145 is as follows.

When the display device DD is in a normal state (or a state in which the first and second conductive balls 151 and 152 are not oxidized (or corroded)), the control signal generator 145 may supply (or output) the first gate driver control signal SCS1, the second gate driver control signal SCS2, the first emission driver control signal ECS1, and the second emission driver control signal ECS2 to the first and second conductive balls 151 and 152 through the output pad unit 146. The first gate driver control signal SCS1, the second gate driver control signal SCS2, the first emission driver control signal ECS1, and the second emission driver control signal ECS2 may be signals supplied from the timing controller 142.

When the first conductive ball 151 is in a state in which the first conductive ball 151 is oxidized (or corroded), the control signal generator 145 may modify the first gate driver control signal SCS1 and the first emission driver control signal ECS1. Also, the control signal generator 145 may supply (or output) a modified first gate driver control signal SCS1' (refer to FIG. 8) to the first conductive ball 151 through the output pad unit 146. The control signal generator 145 may supply (or output) a modified first emission driver control signal ECS1' (refer to FIG. 8) to the first conductive ball 151 through the output pad unit 146.

When the second conductive ball 152 is in a state in which the second conductive ball 152 is oxidized (or corroded), the control signal generator 145 may modify the second gate driver control signal SCS2 and the second emission driver control signal ECS2. Also, the control signal generator 145 may supply (or output) a modified second gate driver control signal SCS2' (refer to FIG. 8) to the second conductive ball 152 through the output pad unit 146. The control signal generator 145 may supply (or output) a modified second emission driver control signal ECS2' (refer to FIG. 8) to the second conductive ball 152 through the output pad unit 146.

The output pad unit 146 may be electrically connected to the data driver 143 and the third conductive ball 153, to receive data signals from the data driver 143 and transfer the data signals to the third conductive ball 153.

The output pad unit 146 may be electrically connected to the control signal generator 145 and the first conductive ball 151. When the display device DD is in a normal state, the output pad unit 146 may receive signals (e.g., the first gate driver control signal SCS1, the first emission driver control signal ECS1, or the like) from the control signal generator 145. When the first conductive ball 151 is in a state in which the first conductive ball 151 is oxidized (or corroded), the output pad unit 146 may receive signals (e.g., the modified first gate driver control signal SCS1', the modified first emission driver control signal ECS1', or the like) from the control signal generator 145. Also, the output pad unit 146 may transfer the received signals to the first conductive ball 151.

The output pad unit 146 may be electrically connected to the control signal generator 145 and the second conductive ball 152. When the display device DD is in a normal state, the output pad unit 146 may receive signals (e.g., the second gate driver control signal SCS2, the second emission driver control signal ECS2, or the like) from the control signal generator 145. When the second conductive ball 152 is in a state in which the second conductive ball 152 is oxidized (or corroded), the output pad unit 146 may receive signals (e.g., the modified second gate driver control signal SCS2', the modified second emission driver control signal ECS2', or the like) from the control signal generator 145. Also, the output pad unit 146 may transfer the received signals to the second conductive ball 152.

Figure 4:
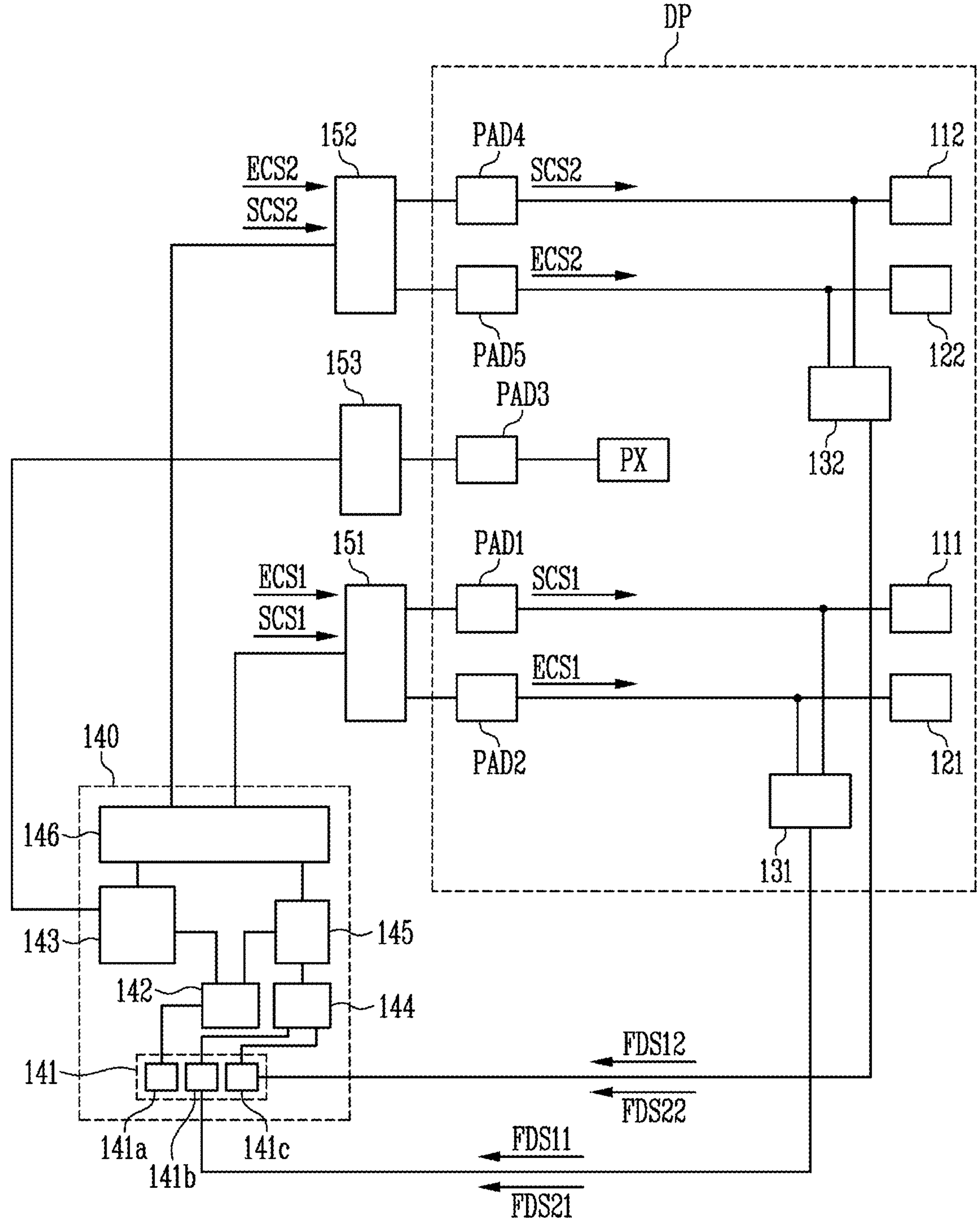
FIG. 4 is a schematic diagram illustrating an embodiment of the display device shown in FIG. 1 in a normal state.

FIG. 4 is a schematic diagram illustrating an embodiment of the display device shown in FIG. 1 in a normal state. The normal state of the display device DD may be defined as a state in which the conductive balls 150 are not oxidized (or corroded).

Referring to FIG. 4, the driving integrated circuit 140 may supply the first gate driver control signal SCS1 and the first emission driver control signal ECS1 to the first conductive ball 151. Similarly, the driving integrated circuit 140 may supply the second gate driver control signal SCS2 and the second emission driver control signal ECS2 to the second conductive ball 152.

The first conductive ball 151 may transfer the first gate driver control signal SCS1 to the first pad PAD1. The first conductive ball 151 may transfer the first emission driver control signal ECS1 to the second pad PAD2.

The second conductive ball 152 may transfer the second gate driver control signal SCS2 to the fourth pad PAD4. The second conductive ball 152 may transfer the second emission driver control signal ECS2 to the fifth pad PAD5.

The first pad PAD1 may transfer the first gate driver control signal SCS1 to the first gate driver 111. The second pad PAD2 may transfer the first emission driver control signal ECS1 to the first emission driver 121. The fourth pad PAD4 may transfer the second gate driver control signal SCS2 to the second gate driver 112. The fifth pad PAD5 may transfer the second emission driver control signal ECS2 to the second emission driver 122.

The first test pad 131 may detect the first gate driver control signal SCS1 transferred to the first gate driver 111. The first test pad 131 may transfer the detected first gate driver control signal SCS1 in the form of the eleventh feedback signal FDS11 to the driving integrated circuit 140.

Similarly, the first test pad 131 may detect the first emission driver control signal ECS1 transferred to the first emission driver 121. The first test pad 131 may transfer the detected first emission driver control signal ECS1 in the form of the twenty-first feedback signal FDS21 to the driving integrated circuit 140.

The second test pad 132 may detect the second gate driver control signal SCS2 transferred to the second gate driver 112. The second test pad 132 may transfer the detected second gate driver control signal SCS2 in the form of the twelfth feedback signal FDS12 to the driving integrated circuit 140.

Similarly, the second test pad 132 may detect the second emission driver control signal ECS2 transferred to the second emission driver 122. The second test pad 132 may transfer the detected second emission driver control signal ECS2 in the form of the twenty-second feedback signal FDS22 to the driving integrated circuit 140.

The driving integrated circuit 140 may compare the waveform of the first gate driver control signal SCS1 with the waveform of the eleventh feedback signal FDS11. The driving integrated circuit 140 may compare the waveform of the first emission driver control signal ECS1 with the waveform of the twenty-first feedback signal FDS21. The driving integrated circuit 140 may compare the waveform of the second gate driver control signal SCS2 with the waveform of the twelfth feedback signal FDS12. The driving integrated circuit 140 may compare the waveform of the second emission driver control signal ECS2 with the waveform of the twenty-second feedback signal FDS22.

When waveforms of signals corresponding to each other are substantially the same, the above-described process may be repeated. When the display device DD is in a normal state, waveforms of signals corresponding to each other will be described with reference to FIG. 5.

Figure 5:
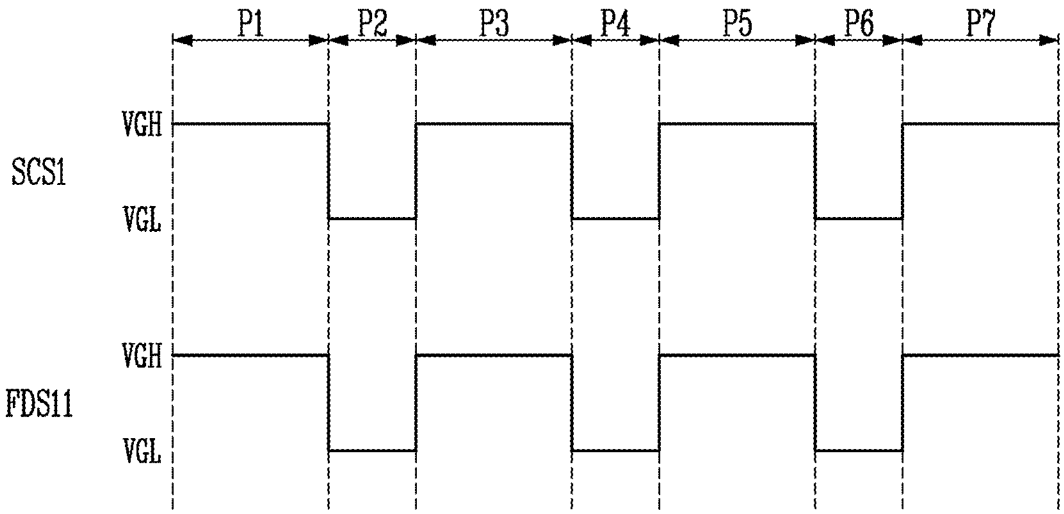
FIG. 5 illustrates schematic waveform diagrams of a first gate driver control signal and an eleventh feedback signal when the display device shown in FIG. 1 is in a normal state.

FIG. 5 illustrates schematic waveform diagrams of the first gate driver control signal and the eleventh feedback signal when the display device shown in FIG. 1 is in a normal state. The first gate driver control signal SCS1 and the eleventh feedback signal FDS11 will be described as an example.

Referring to FIG. 5, in an embodiment, the first gate driver control signal SCS1 may be provided in a pulse form alternately having a first gate power voltage VGH and a second gate power voltage VGL. In an embodiment, the first gate driver control signal SCS1 may have the first gate power voltage VGH in a first period P1, a third period P3, a fifth period P5, and a seventh period P7, for example. Also, the first gate driver control signal SCS1 may have the second gate power voltage VGL in a second period P2, a fourth period P4, and a sixth period P6. However, embodiments of the disclosure are not necessarily limited thereto. The first gate driver control signal SCS1 may be provided in various forms.

When the display device DD is in a normal state (e.g., a state in which the first conductive ball 151 is not oxidized (or corroded)), a waveform of the first gate driver control signal SCS1 may be substantially identical to a waveform of the eleventh feedback signal FDS11. In an embodiment, the eleventh feedback signal FDS11 may have the first gate power voltage VGH in the first period P1, the third period P3, the fifth period P5, and the seventh period P7, for example. Also, the eleventh feedback signal FDS11 may have the second gate power voltage VGL in the second period P2, the fourth period P4, and the sixth period P6.

Similarly, when the display device DD is in a normal state, a waveform of the second gate driver control signal SCS2 may be substantially identical to a waveform of the twelfth feedback signal FDS12. A waveform of the first emission driver control signal ECS1 may be substantially identical to a waveform of the twenty-first feedback signal FDS21. A waveform of the second emission driver control signal ECS2 may be substantially identical to a waveform of the twenty-second feedback signal FDS22.

Figure 6:
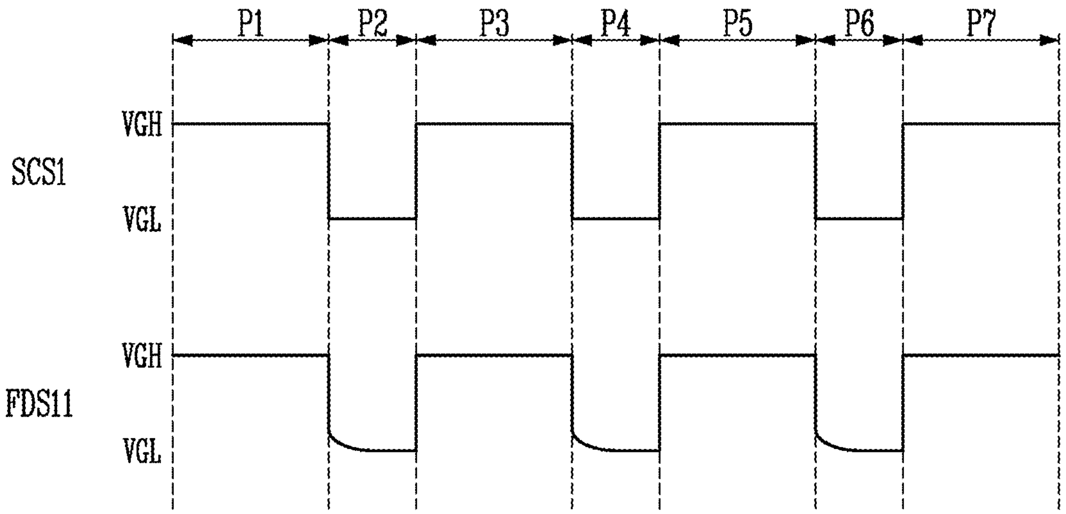
FIGS. 6 and 7 illustrate schematic waveform diagrams of the first gate driver control signal and the eleventh feedback signal when the display device shown in FIG. 1 is in an abnormal state.
Figure 7:
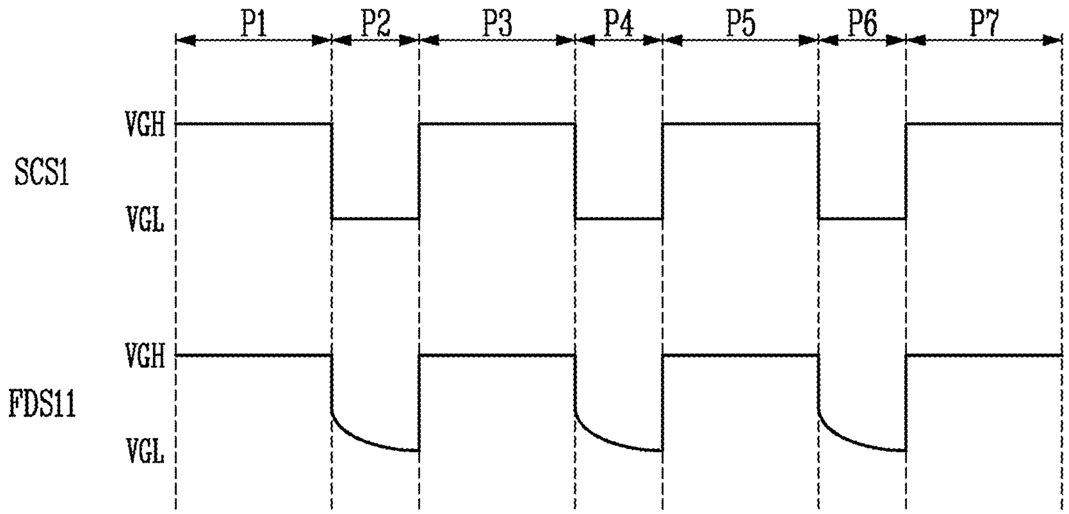

FIGS. 6 and 7 illustrate schematic waveform diagrams of the first gate driver control signal and the eleventh feedback signal when the display device shown in FIG. 1 is in an abnormal state. FIG. 6 illustrates a waveform of an embodiment of the first gate driver control signal SCS1 and a waveform of the eleventh feedback signal FDS11 when the first conductive ball 151 is oxidized (or corroded) in accordance with the disclosure. FIG. 7 illustrates a waveform of an embodiment of the first gate driver control signal SCS1 and a waveform of the eleventh feedback signal FDS11 when the degree to which the first conductive ball 151 is oxidized (or corroded) becomes severer in accordance with the disclosure.

Referring to FIG. 6, with respect to the first gate driver control signal SCS1, descriptions of portions overlapping with those described with reference to FIG. 5 will be omitted below.

When the first conductive ball 151 is oxidized (or corroded), the magnitude of resistance in the first conductive ball 151 may become larger. The transmission rate of a signal through the first conductive ball may become slower. As the transmission rate of the signal becomes slower, a slew may occur between a signal input to the first conductive ball 151 and a signal output from the first conductive ball 151. In addition, a waveform of the first gate driver control signal SCS1 and a waveform of the eleventh feedback signal FDS11 may be different from each other in at least a partial period.

In an embodiment, in a second period P2, a slew may occur between the first gate driver control signal SCS1 and the eleventh feedback signal FDS11, for example. In addition, the waveforms of the first gate driver control signal SCS1 and the eleventh feedback signal FDS11 may be different from each other in the second period P2.

In an embodiment, in a fourth period P4, a slew may occur between the first gate driver control signal SCS1 and the eleventh feedback signal FDS11, for example. In addition, the waveforms of the first gate driver control signal SCS1 and the eleventh feedback signal FDS11 may be different from each other in the fourth period P4.

In an embodiment, in a sixth period P6, a slew may occur between the first gate driver control signal SCS1 and the eleventh feedback signal FDS11, for example. In addition, the waveforms of the first gate driver control signal SCS1 and the eleventh feedback signal FDS11 may be different from each other in the sixth period P6.

Referring to FIG. 7, when the degree to which the first conductive ball 151 is oxidized (or corroded) becomes severer, the magnitude of the resistance in the first conductive ball 151 may become larger. The transmission rate of the signal through the first conductive ball 151 may become slower. As the transmission rate of the signal becomes slower, the degree to which the slew occurs between the signal input to the first conductive ball 151 and the signal output from the first conductive ball 151 may become larger. In an embodiment, as compared with FIG. 6, in FIG. 7, it may be seen that a difference between a value of the eleventh feedback signal FDS11 at a start point of the second period P2 and a value of the eleventh feedback signal FDS11 at an end point of the second period P2 becomes larger, for example.

As the degree to which the first conductive ball 151 is oxidized (or corroded) becomes larger, an unintended modification degree of signals passing through the first conductive ball 151 may become larger. An operation of the driving integrated circuit 140 for delaying oxidation (or corrosion) of the conductive balls 150 will be described later with reference to FIGS. 8 and 9.

Figure 8:
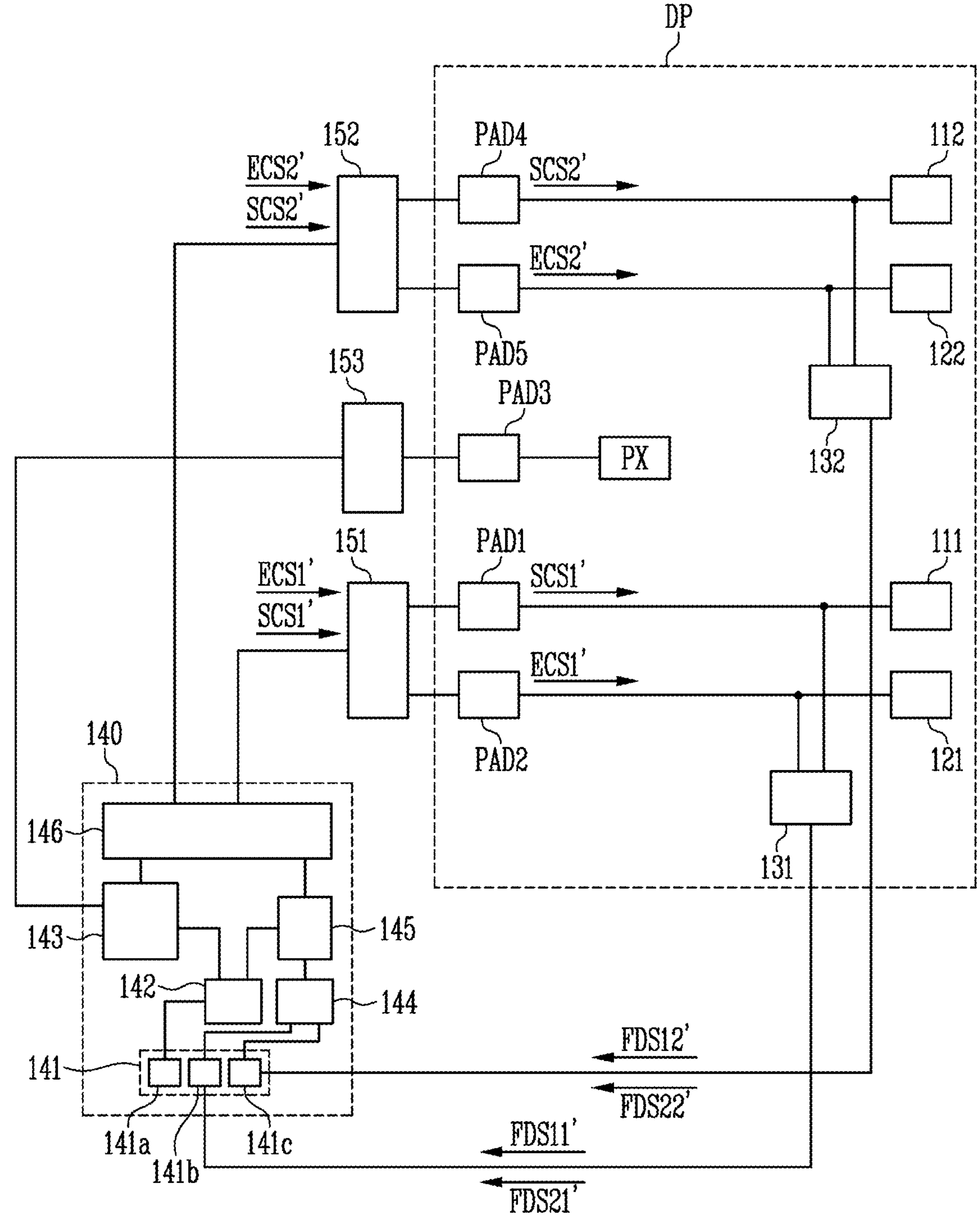
FIG. 8 is a schematic diagram illustrating an embodiment when the display device shown in FIG. 1 is in an abnormal state.

FIG. 8 is a schematic diagram illustrating an embodiment when the display device shown in FIG. 1 is in an abnormal state.

Referring to FIG. 8, the driving integrated circuit 140 may supply a modified first gate driver control signal SCS1' and a modified first emission driver control signal ECS1' to the first conductive ball 151. Similarly, the driving integrated circuit 140 may supply a modified second gate driver control signal SCS2' and a modified second emission driver control signal ECS2' to the second conductive ball 152.

The first conductive ball 151 may transfer the modified first gate driver control signal SCS1' to the first pad PAD1. The first conductive ball 151 may transfer the modified first emission driver control signal ECS1' to the second pad PAD2.

The second conductive ball 152 may transfer the modified second gate driver control signal SCS2' to the fourth pad PAD4. The second conductive ball 152 may transfer the modified second emission driver control signal ECS2' to the fifth pad PAD5.

The first pad PAD1 may transfer the modified first gate driver control signal SCS1' to the first gate driver 111. The second pad PAD2 may transfer the modified first emission driver control signal ECS1' to the first emission driver 121. The fourth pad PAD4 may transfer the modified second gate driver control signal SCS2' to the second gate driver 112. The fifth pad PAD5 may transfer the modified second emission driver control signal ECS2' to the second emission driver 122.

The first test pad 131 may detect the modified first gate driver control signal SCS1' transferred to the first gate driver 111. The first test pad 131 may transfer the detected modified first gate driver control signal SCS1' in the form of an eleventh feedback signal (also referred to a first feedback signal) FDS11' to the driving integrated circuit 140.

Similarly, the first test pad 131 may detect the modified first emission driver control signal ECS1' transferred to the first emission driver 121. The first test pad 131 may transfer the detected modified first emission driver control signal ECS1' in the form of a twenty-first feedback signal FDS21' to the driving integrated circuit 140.

The second test pad 132 may detect the modified second gate driver control signal SCS2' transferred to the second gate driver 112. The second test pad 132 may transfer the detected modified second gate driver control signal SCS2' in the form of a twelfth feedback signal (also referred to a second feedback signal) FDS12' to the driving integrated circuit 140.

Similarly, the second test pad 132 may detect the modified second emission driver control signal ECS2' transferred to the second emission driver 122. The second test pad 132 may transfer the detected modified second emission driver control signal ECS2' in the form of a twenty-second feedback signal FDS22' to the driving integrated circuit 140.

The driving integrated circuit 140 may compare a waveform of the modified first gate driver control signal SCS1' with a waveform of the eleventh feedback signal FDS11'. The driving integrated circuit 140 may compare a waveform of the modified first emission driver control signal ECS1' with a waveform of the twenty-first feedback signal FDS21'. The driving integrated circuit 140 may compare a waveform of the modified second gate driver control signal SCS2' with a waveform of the twelfth feedback signal FDS12'. The driving integrated circuit 140 may compare a waveform of the modified second emission driver control signal ECS2' with a waveform of the twenty-second feedback signal FDS22'.

As the above-described waveform comparison results, when waveforms of signals corresponding to each other are substantially identical to each other, the driving integrated circuit 140 may not additionally modify amplitudes of signals output from the driving integrated circuit 140 to become smaller.

When a difference between waveforms of signals corresponding to each other becomes larger, the driving integrated circuit 140 may modify amplitudes of signals output from the driving integrated circuit 140 to become smaller. As the amplitudes of the signals output from the driving integrated circuit 140 become smaller, the oxidation (or corrosion) rate of the conductive balls 150 may become slower.

Figure 9:
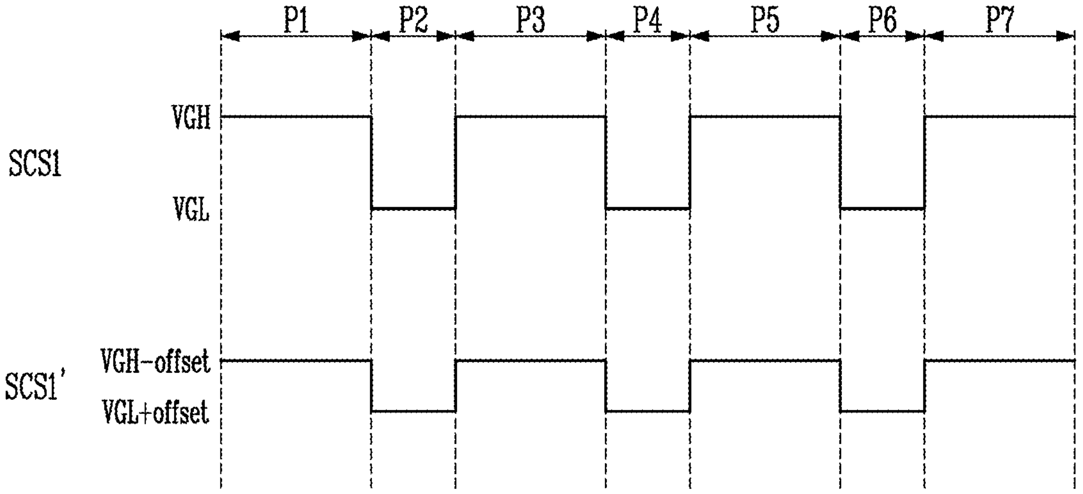
FIG. 9 illustrates schematic waveform diagrams of the first gate driver control signal and a modified first gate driver control signal shown in FIG. 8.

FIG. 9 illustrates schematic waveform diagrams of the first gate driver control signal and the modified first gate driver control signal shown in FIG. 8.

Referring to FIG. 9, with respect to the first gate driver control signal SCS1, descriptions of portions overlapping with those described with reference to FIG. 5 will be omitted below.

The modified first gate driver control signal SCS1' may have a waveform of which amplitude becomes relatively small as compared with the first gate driver control signal SCS1. In an embodiment, an amplitude of the modified first gate driver control signal SCS1' may be different by an offset voltage offset from an amplitude of the first gate driver control signal SCS1, for example.

The driving integrated circuit 140 may output the first gate driver control signal SCS1' of which amplitude becomes small, to weaken the intensity of an electric field generated by a potential difference between the driving integrated circuit 140 and the first conductive ball 151. In addition, this may make it difficult for electrons of the first conductive ball 151 to move to the driving integrated circuit 140. Accordingly, the oxidation (or corrosion) rate of the first conductive ball 151 may be reduced.

Figure 10:
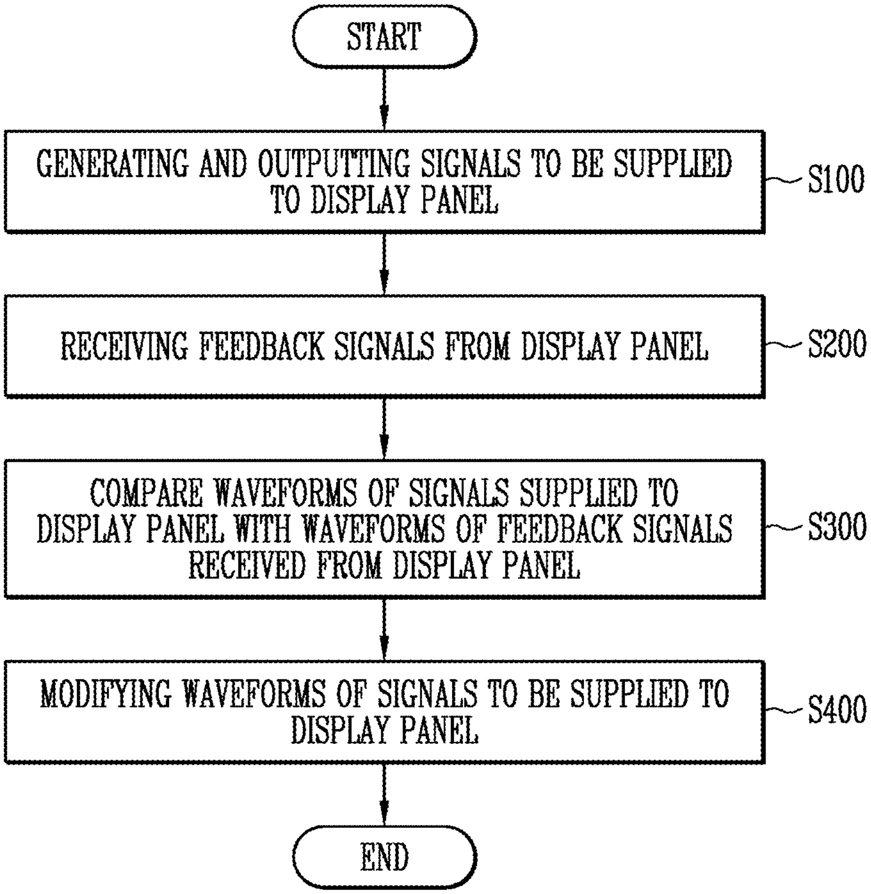
FIG. 10 is a flowchart illustrating a method of driving the display device shown in FIG. 1.

FIG. 10 is a flowchart illustrating a method of driving the display device shown in FIG. 1.

Referring to FIGS. 1 to 10, first, the driving integrated circuit 140 may perform operation S100 of generating and outputting signals (e.g., the first gate driver control signal SCS1, the second gate driver control signal SCS2, the first emission driver control signal ECS1, the second emission driver control signal ECS2, or the like) to be supplied to the display panel DP.

The driving integrated circuit 140 may perform operation S200 of receiving feedback signals (e.g., the eleventh feedback signal FDS11, the twelfth feedback signal FDS12, the twenty-first feedback signal FDS21, and the twenty-second feedback signal FDS22) from the display panel DP.

The driving integrated circuit 140 may perform operation S300 of comparing waveforms of the signals supplied to the display panel DP with waveforms of the feedback signals received from the display panel DP. In an embodiment, the driving integrated circuit 140 may determine whether the first conductive ball 151 is in a state in which the first conductive ball 151 is oxidized (or corroded) by comparing the waveform of the first gate driver control signal SCS1 with the waveform of the eleventh feedback signal FDS11, for example. In an embodiment, the driving integrated circuit 140 may determine whether the second conductive ball 152 is in a state in which the second conductive ball 152 is oxidized (or corroded) by comparing the waveform of the second gate driver control signal SCS2 with the waveform of the twelfth feedback signal FDS12, for example.

The driving integrated circuit 140 may perform operation S400 of modifying the waveforms of the signals to be supplied to the display panel DP when the display device DD is in an abnormal state.

In an embodiment, when the first conductive ball 151 is in a state in which the first conductive ball 151 is oxidized (or corroded), the driving integrated circuit 140 may decrease the magnitudes of amplitudes of the first gate driver control signal SCS1 and the first emission driver control signal ESC1, for example.

In an embodiment, when the second conductive ball 152 is in a state in which the second conductive ball 152 is oxidized (or corroded), the driving integrated circuit 140 may decrease the magnitudes of amplitudes of the second gate driver control signal SCS2 and the second emission driver control signal ECS2, for example.

Figure 11:
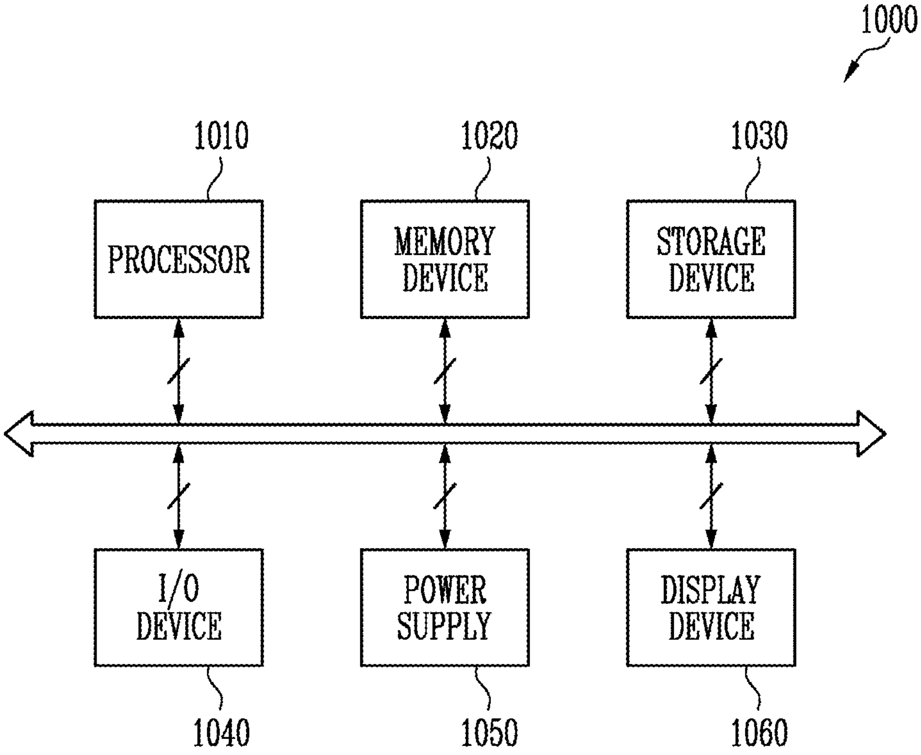
FIG. 11 is a block diagram illustrating an embodiment of an electronic device in accordance with the disclosure.
Figure 12:
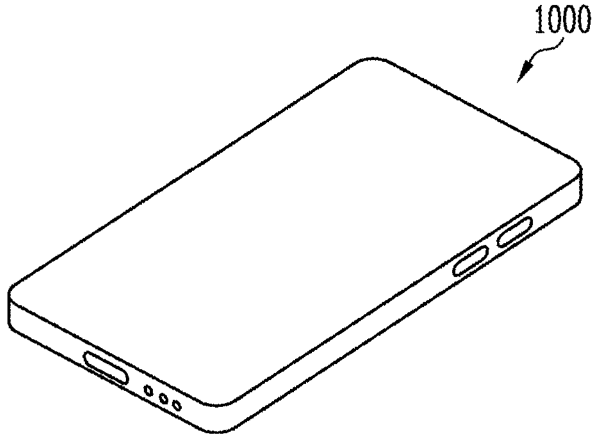
FIG. 12 is a diagram illustrating an embodiment in which the electronic device shown in FIG. 11 is implemented as a smartphone.

FIG. 11 is a block diagram illustrating an embodiment of an electronic device in accordance with the disclosure. FIG. 12 is a diagram illustrating an embodiment in which the electronic device shown in FIG. 11 is implemented as a smartphone.

Referring to FIGS. 11 and 12, the electronic device 1000 may include a processor 1010, a memory device 1020, a storage device 1030, an input/output ("I/O") device 1040, a power supply 1050, and a display device 1060. The display device 1060 may be the display device shown in FIG. 1. Also, the electronic device 1000 may further include several ports capable of communicating with a video card, a sound card, a memory card, a universal serial bus ("USB") device, or the like, or communicating with other systems. In an embodiment, as shown in FIG. 12, the electronic device 1000 may be implemented as a smartphone. However, this is merely illustrative, and the electronic device 1000 is not limited thereto. In an embodiment, the electronic device 1000 may be implemented as a mobile phone, a video phone, a smart pad, a smart watch, a tablet personal computer ("PC"), a vehicle navigation system, a computer monitor, a notebook computer, a head disposed (e.g., mounted) display device, or the like, for example.

The processor 1010 may perform predetermined calculations or tasks. In some embodiments, the processor 1010 may be a microprocessor, a central processing unit, an application processor, or the like. The processor 1010 may be connected to other components through an address bus, a control bus, a data bus, or the like. In some embodiments, the processor 1010 may be connected to an extension bus such as a peripheral component interconnect ("PCI") bus.

The memory device 1020 may store data desired for an operation of the electronic device 1000. In an embodiment, the memory device 1010 may include a nonvolatile memory device such as an erasable programmable read-only memory ("EPROM") device, an electrically erasable programmable read-Only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, or a ferroelectric random access memory ("FRAM") device, and/or a volatile memory device such as a dynamic random access memory ("DRAM") device, a static random access memory ("SRAM") device, or a mobile DRAM device, for example.

The storage device 1030 may include a solid state drive ("SSD"), a hard disk drive ("HDD"), a compact disc read-only memory ("CD-ROM"), or the like.

The I/O device 1040 may include an input means such as a keyboard, a keypad, a touch screen, or a mouse, and an output means such as a speaker or a printer. In some embodiments, the display device 1060 may be included in the I/O device 1040.

The power supply 1050 may supply power desired for an operation of the electronic device 1000. In an embodiment, the power supply 1050 may be a power management integrated circuit ("PMIC"), for example.

The display device 1060 may display an image corresponding to visual information of the electronic device 1000. The display device 1060 may be an organic light-emitting display device or a quantum dot light-emitting display device, but the disclosure is not limited thereto. The display device 1060 may be connected to other components through the buses or another communication link.

In accordance with the disclosure, control signals supplied to the display panel are adjusted, thereby reducing a corrosion rate of the conductive balls.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. An electronic device comprising:
a display device comprising:
a display panel including:
a plurality of pixels;
a first gate driver which supplies gate signals to the plurality of pixels; and
a first pad; and
a first test pad directly connected to the first pad;
a driving integrated circuit which generates and outputs a first gate driver control signal to be supplied to the first gate driver of the display panel, and feeds back, as a first feedback signal, the first gate driver control signal provided to the display panel; and
a first conductive ball electrically connecting the driving integrated circuit and the display panel to each other,
wherein the driving integrated circuit compares a waveform of the first gate driver control signal with a waveform of the first feedback signal,
the first pad receives the first gate driver control signal from the driving integrated circuit through the first conductive ball; and
the first test pad detects the first gate driver control signal passing through the first pad, and transfers the first gate driver control signal as the first feedback signal to the driving integrated circuit.

2. The electronic device of claim 1, further comprising a second conductive ball electrically connecting the driving integrated circuit and the display panel to each other,
wherein the driving integrated circuit generates and outputs a second gate driver control signal, and feeds back, as a second feedback signal, the second gate driver control signal provided to the display panel, and
wherein the driving integrated circuit compares a waveform of the second gate driver control signal with a waveform of the second feedback signal.

3. The electronic device of claim 2, wherein the display panel further includes:
a second gate driver which is spaced apart from the first gate driver in a first direction, and supplies the gate signals to the plurality of pixels;
a fourth pad which receives the second gate driver control signal from the driving integrated circuit through the second conductive ball; and
a second test pad which detects the second gate driver control signal passing through the fourth pad, and transfers the second gate driver control signal as the second feedback signal to the driving integrated circuit.

4. The electronic device of claim 2, wherein the first gate driver control signal and the second gate driver control signal are substantially identical to each other.

5. The electronic device of claim 2, wherein the driving integrated circuit includes:
a timing controller which generates the first gate driver control signal;
input pads including a 1bth input pad which receives the first feedback signal transferred from the first test pad; and
a waveform comparator which compares the waveform of the first gate driver control signal with the waveform of the first feedback signal, and compares the waveform of the second gate driver control signal with the waveform of the second feedback signal.

6. The electronic device of claim 5, wherein the driving integrated circuit further includes a control signal generator which receives a waveform comparison result transferred from the waveform comparator, and wherein the control signal generator modifies the first gate driver control signal, based on the waveform comparison result.

7. The electronic device of claim 6, wherein the driving integrated circuit further includes an output pad unit which connects the control signal generator to the first conductive ball, and wherein the output pad unit applies a modified first gate driver control signal output from the control signal generator to the first conductive ball.

8. The electronic device of claim 6, wherein a magnitude of an amplitude of a modified first gate driver control signal is smaller than a magnitude of an amplitude of the first gate driver control signal.

9. The electronic device of claim 6, wherein the control signal generator modifies the first gate driver control signal when the waveform of the first gate driver control signal and the waveform of the first feedback signal are different from each other in at least a partial period.

10. A method of driving an electronic device comprising a display device including a display panel, a driving integrated circuit and a first conductive ball electrically connected to the display panel, the method comprising:

generating and outputting a first gate driver control signal to be supplied to a first gate driver of the display panel;

feeding back the first gate driver control signal as a first feedback signal from the display panel; and comparing a waveform of the first gate driver control signal with a waveform of the first feedback signal, wherein a first pad of the display panel receives the first gate driver control signal from the driving integrated circuit through the first conductive ball, the first gate driver control signal passing through the first pad is fed back as the first feedback signal by a first test pad of the display panel, and the first test pad is directly connected to the first pad.

11. The method of claim 10, wherein the display device further includes a second conductive ball electrically connected to the display panel, and wherein the method further comprises:

generating and outputting a second gate driver control signal to be supplied to the display panel;

feeding back the second gate driver control signal as a second feedback signal from the display panel; and comparing a waveform of the second gate driver control signal with a waveform of the second feedback signal.

12. The method of claim 11, wherein the display panel further includes a fourth pad and a second test pad, and wherein the second gate driver control signal passing through the fourth pad is fed back as the second feedback signal by the second test pad.

13. The method of claim 11, wherein the first gate driver control signal and the second gate driver control signal are substantially identical to each other.

14. The method of claim 11, wherein the first gate driver control signal is modified based on a result obtained by comparing the waveform of the first gate driver control signal with the waveform of the first feedback signal.

15. The method of claim 14, wherein the modified first gate driver control signal is applied to the first conductive ball.

16. The method of claim 14, wherein a magnitude of an amplitude of the modified first gate driver control signal is smaller than a magnitude of an amplitude of the first gate driver control signal.

17. The method of claim 14, wherein the first gate driver control signal is modified when the waveform of the first gate driver control signal and the waveform of the first feedback signal are different from each other in at least a partial period.

* * * * *